(12) United States Patent
Chang et al.

(10) Patent No.: US 8,555,119 B2
(45) Date of Patent: Oct. 8, 2013

(54) TEST STRUCTURE FOR CHARACTERIZING MULTI-PORT STATIC RANDOM ACCESS MEMORY AND REGISTER FILE ARRAYS

(75) Inventors: Leland Chang, New York, NY (US); Jente B. Kuang, Austin, TX (US); Robert K. Montoye, New York, NY (US); Hung C. Ngo, Austin, TX (US); Kevin J. Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/459,932

(22) Filed: Apr. 30, 2012

(65) Prior Publication Data
US 2012/0212997 A1     Aug. 23, 2012

Related U.S. Application Data

(62) Division of application No. 11/552,158, filed on Oct. 24, 2006, now Pat. No. 8,261,138.

(51) Int. Cl.
*G11C 29/00* (2006.01)

(52) U.S. Cl.
USPC ........................................................ 714/718

(58) Field of Classification Search
USPC .......... 714/718, 726, 727, 729, 823; 365/154, 365/201, 233.1; 716/136
See application file for complete search history.

(56) References Cited

U.S. PATENT DOCUMENTS

| | | | | |
|---|---|---|---|---|
| 7,483,322 B2* | 1/2009 | Joshi et al. | ..................... | 365/201 |
| 7,545,690 B2* | 6/2009 | Kuang et al. | .................. | 365/201 |
| 7,742,326 B2* | 6/2010 | Houston | ........................ | 365/154 |
| 8,261,138 B2* | 9/2012 | Chang et al. | .................. | 714/718 |
| 2012/0243302 A1* | 9/2012 | Nii et al. | ........................ | 365/154 |

* cited by examiner

*Primary Examiner* — Phung M Chung
(74) *Attorney, Agent, or Firm* — Yudell Isidore Ng Russell PLLC

(57) ABSTRACT

A test structure for characterizing a production static random access memory (SRAM) array. The test structure includes a characterization circuit having multiple memory cell columns connected in series to form a ring configuration. The characterization circuit is fabricated on a wafer substrate in common with and proximate to a production SRAM array. The characterization circuit preferably includes SRAM cells having a circuit topology substantially identical to the circuit topology of memory cells within the production SRAM array. In one embodiment, the test structure is utilized for characterizing a multi-port memory array and includes multiple memory cell columns connected in series to form a ring oscillator characterization circuit. Each cell column in the characterization circuit includes multiple SRAM cells each having a latching node and multiple data path access nodes. Selection control circuitry selectively enables the multiple data path access nodes for the SRAM cells within the characterization circuit.

9 Claims, 10 Drawing Sheets

TEST STRUCTURE FOR CHARACTERIZING MULTI-PORT STATIC RANDOM ACCESS MEMORY AND REGISTER FILE ARRAYS

The present application is a divisional of U.S. Pat. No. 8,261,138, entitled "TEST STRUCTURE FOR CHARACTERIZING MULTI-PORT STATIC RANDOM ACCESS MEMORY AND REGISTER FILE ARRAYS" the disclosure of which is hereby incorporated herein by reference in its entirety for all purposes.

The present invention was made with Government support under PERCS II, NBCH3039004. The government has certain rights in the present invention.

BACKGROUND OF THE INVENTION

1. Technical Field

The present invention generally relates to circuit test structures, and in particular to test structures for testing data path cycle times and other functional operational characteristics of memory arrays. Still more particularly, the present invention relates to a test structure for characterizing production static random access memory (SRAM) arrays and register file memories in a manner that accounts for fabrication layout characteristics as well as circuit topology characteristics such as bitline loading without changing the structure or behavior of the production array.

2. Description of Related Art

Memory speed poses a major limitation to modern data processing systems. It has been predicted that memory speed will become even more of a critical limitation as processor technologies move forward. In order to bridge the significant processing cycle gaps between processors and system memories (typically made of dynamic random access memories), SRAMs are commonly used as cache memories within processors for fast access to data and instructions.

With technology scaling on SRAM cells, certain device parameters, such as threshold voltage, become more susceptible to process variations. In order to come up with an optimal design for an SRAM array, an SRAM designer must have a clear understanding of various process variations in the processing technology for manufacturing SRAM arrays. Such information can typically be gained by using a simple test circuit for characterizing SRAM arrays.

In order to have the best result when characterizing a SRAM array, a test structure should be able to mimic an operating condition very close to true bitline loading. Also, the test structure should have the device and interconnect layout characteristics of the SRAM cells within the SRAM array. In addition, any electric circuit for tracking the characteristics of local bitlines within the test structure should not add extraneous load on the local bitlines of the production SRAM array.

The present disclosure describes a test system for evaluating the cell, subarray and array performance of a production memory array using a proxy memory array test structure that substantially replicates the on-chip physical device and interconnection layout of the functional memory array and which is fabricated and operated under conditions that closely approximate local bitline loading characteristics of the production array.

SUMMARY OF THE INVENTION

A test structure for characterizing a production static random access memory (SRAM) array is disclosed herein. The test structure includes a characterization circuit having multiple memory cell columns connected in series to form a ring configuration. The characterization circuit is fabricated on a wafer substrate in common with and proximate to a production SRAM array. The characterization circuit preferably includes SRAM cells having a circuit topology substantially identical to the circuit topology of memory cells within the production SRAM array. In one embodiment, the test structure is utilized for characterizing a multi-port memory array and includes multiple memory cell columns connected in series to form a ring oscillator characterization circuit. Each cell column in the characterization circuit includes multiple SRAM cells each having a latching node and multiple data path access nodes. Selection control circuitry selectively enables the multiple data path access nodes for the SRAM cells within the characterization circuit.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention is directed to a test structure for evaluating performance of memory arrays such multi-ported static random access memory (SRAM) and register file memory arrays. The test structure of the present invention generally comprises memory array structures, including multi-ported SRAM cells that mirror a non-testing, production memory array structure. As utilized herein, "production array" refers to a functional memory array having structural and functional characteristics that are imitated by the test structure of the present invention. The term "production" is generally applied for ease of reference and applies to commercial memory arrays products sold and implemented in a functional capacity in data processing systems. It should be noted that test arrays used for non-commercial research analysis may also be considered "production" arrays within the spirit and scope of the present invention.

The test structure of the present invention includes multiple multi-ported memory cells interconnected to form a memory cell column in which the input and output local bitlines have loading characteristics that mirror bitline loading of the production memory array. Multiple of the memory cell columns are coupled in series to form a ring oscillator test structure. The ring oscillator test structure is preferably fabricated on the same semiconductor wafer substrate as the corresponding production array. Preferably, the test structure is fabricated on the same integrated circuit (IC) chip proximate to the production array and furthermore has a memory cell circuit topology and device and interconnect fabrication layout geometry substantially identical to the circuit topology and fabrication layout geometry of the corresponding production array. The test structure can be fabricated and utilized in association with the production array for ongoing product categorization and analysis or in association with a test array for research analysis.

As described and depicted in further detail below with reference to the figures, test structures in accordance with the present invention mimic the structure and local data line loading characteristics of the production memory arrays in a manner enabling accurate and flexible assessment of memory array behavior. The test structure provides memory cell performance testing of subarray read and write access operations in a manner that does not alter the structure or performance of the object production memory cell. The cell performance monitoring includes tracking local bitline loading characteristics, tracking read path access, tracking write path properties, and tracking precharge device properties for read bitline precharge SRAM topologies. As explained in further detail below with reference to FIGS. 5 and 6, one embodiment of the test structure further enables tracking of scan path properties such as serial data input paths utilized in boundary scan testing of memory arrays.

Figure 1:
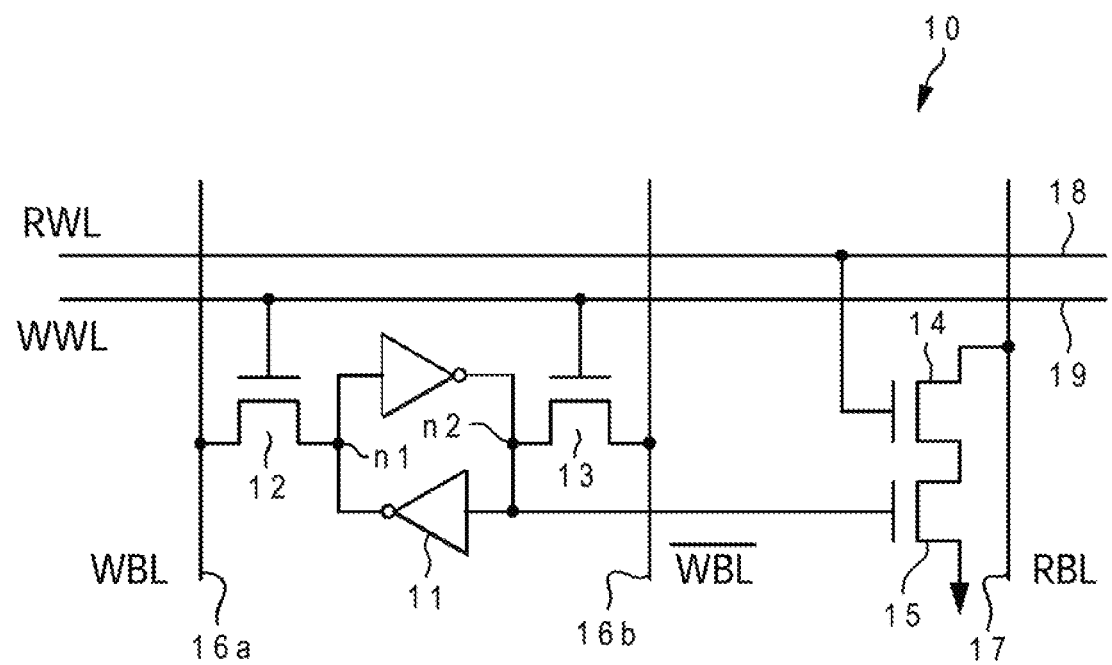
FIG. 1 is a schematic diagram of a memory cell within a static random access memory array, in accordance with a preferred embodiment of the present invention.

Referring now to the drawings and in particular to FIG. 1, there is depicted a schematic diagram of an exemplary memory cell within an SRAM array in accordance with a preferred embodiment of the present invention. As shown, an SRAM cell 10 includes a memory cell 11 formed by two cross-coupled inverters. A write pass transistor 12, having its gate connected to a write wordline (WWL) 19, is coupled between a write bitline (WBL) 16a and a storage node n1. Similarly, a write pass transistor 13, also having its gate connected to WWL 19, is coupled between a complementary write bitline 16b and a storage node n2.

When enabled, write pass transistors 12, 13 allow data to be written into memory cell 11 from WBL 16a and 16b, respectively. Write pass transistors 12, 13 are enabled by WWL 19, which has a state that is a function of the row address within the SRAM array. The row address is decoded by a row decoder (not shown) that is preferably included in selection control circuitry within the SRAM array such as depicted and described in further detail with reference to FIG. 7.

A read pass transistor 14 connected in series with a read pass transistor 15 are coupled between a read bitline (RBL) 17 and ground. The gate of read pass transistor 14 is connected to a read wordline (RWL) 18, and the gate of read pass transistor 15 is connected to storage node n2. Read pass transistor 14 IS enabled by RWL 18, which has a state that is a function of the row address within the SRAM array. When read pass transistor is enabled, read pass transistors 14, 15 allows data to be read from memory cell 11 via RBL 17.

Figure 2:
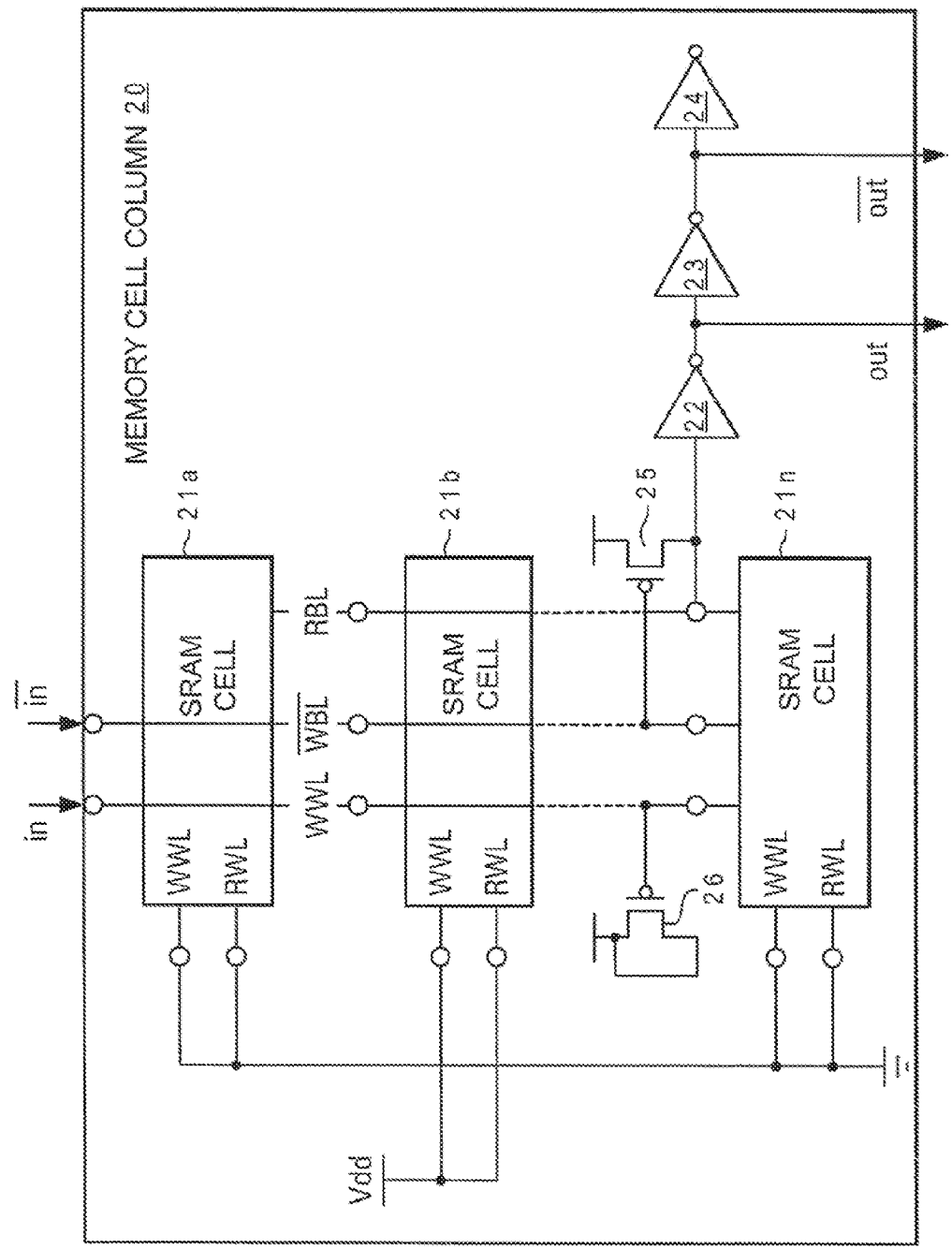
FIG. 2 is a diagram of a column of static random access memory cells, in accordance with a preferred embodiment of the present invention.

With reference now to FIG. 2, there is depicted a diagram of a memory cell column in accordance with one embodiment of the invention. In accordance with the depicted embodiment, a memory cell column 20 generally comprises a column of SRAM cells 21a-21n that forms an oscillator stage as explained in further detail below. Each of SRAM cells 21a-21n is substantially identical to SRAM cell 10 from FIG. 1. The RWL and WWL of SRAM cell 21b are connected to a power supply, thereby enabling the RWL and WWL (i.e. setting the RWL and WWL to a voltage level that enables data to be written to the corresponding data storage latch via the corresponding RBL and WBL. The RWLs and WWLs of SRAM cells 21a and 21c-21n are connected to ground, thereby disabling the corresponding RWLs and WWLs.

Figure 3:
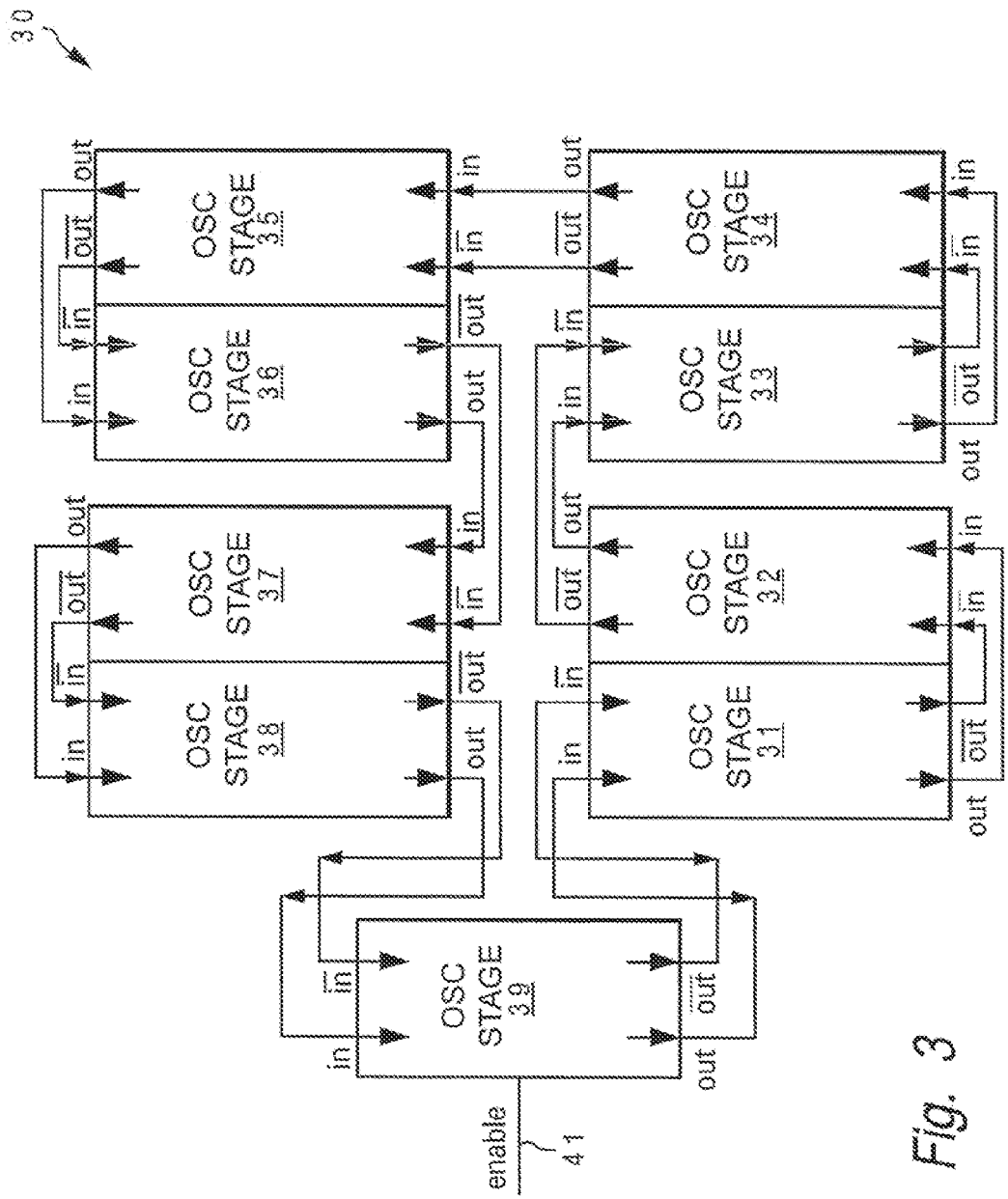
FIG. 3 is a diagram of a test structure in the form of a ring oscillator constructed by multiple columns of static random access memory cells from FIG. 2, in accordance with a preferred embodiment of the present invention.

The WBLs and complementary WBLs of SRAM cells 21a-21n are connected in parallel to form a complementary input node pair for memory cell column 20. The RBLs of SRAM cells 21a-21n are all connected in parallel to provide an output node for memory cell column 20. As shown in the depicted embodiment, inverters 22-24 are connected to the shared RBL output node of SRAM cells 21a-21n. The node between inverters 22 and 23 provides an output, out, and the node between inverters 23 and 24 provides a complementary output. Inverter 24 is a dummy load. As depicted below with reference to FIG. 3, a ring oscillator configuration is formed by connecting the complementary RBL output of a given memory cell column to the complementary WBL input of a subsequent column in the ring. Configured as depicted in FIGS. 2 and 3, and significant to its role as one of an odd number of oscillator stages, each memory cell column inverts the respective complementary inputs received at its complementary WBL input and applies the inverted complementary signal to the input of the next stage.

Continuing with memory cell column 20 depicted in FIG. 2, precharge transistors 25 and 26 are coupled to the output of memory cell column 20. Specifically, the drain of precharge transistor 25 is connected to the power supply, the gate of precharge transistor 25 is connected to the complementary input WBL input node of SRAM cells 21a-21n, and the source of precharge transistor 25 is connected to the RBL output node of SRAM cells 21a-21n. Precharge transistor 26 is a dummy load with its drain and source connected to the power supply and its gate connected to the WBLs of SRAM cells 21a-21n.

In order to form a ring oscillator, an odd number of memory cell columns such as memory cell column 20 are interconnected in a ring configuration. Referring now to FIG. 3, there is depicted a diagram of a ring oscillator characterization circuit formed by multiple columns serving as oscillator stages, in accordance with a preferred embodiment of the present invention. As shown, a ring oscillator characterization circuit 30 has nine oscillator stages 31-39. Oscillator stages 31-38 are substantially identical to memory cell column 20 depicted in FIG. 2. Oscillator stage 39 includes the features of memory cell column 20 and further includes an enable input 41 and associated enable input logic as described in further detail below with reference to FIGS. 4a-4d.

Oscillator stages 31-39 of characterization circuit 30 are mutually arranged in a manner to provide an optimal symmetrical configuration for an odd number stage (nine-stages in the depicted embodiment) ring oscillator having a fabrication layout geometry substantially identical to the fabrication layout geometry of a production SRAM array (not depicted) for which the test structure is designed to test. To this end, in addition to logic and circuit topology symmetry between characterization circuit 30 and a corresponding production array, there is a fabrication layout symmetry between oscillator stages 31-34 and oscillator stages 35-38. In one embodiment, symmetry is promoted by physically arranging oscillator stages 31-38 such that most interconnect distances between oscillator stages are substantially equal. For example, oscillator stage 32 is positioned in opposed alignment between oscillator stages 31 and 33 such that the interconnect distance between oscillator stages 31 and 32 and the interconnect distance between oscillator stages 32 and 33 are substantially equal.

With reference now to FIGS. 4a-4d, there are illustrated several embodiments that may be assumed by start-up stage 39 of characterization circuit 30. Start-up stages 39a-39c in FIGS. 4a-4c, respectively, include many of the components included within memory cell column 20 from FIG. 2. The difference between start-up stage 39a in FIG. 4a and memory cell column 20 is that inverter 23 in FIG. 2 is replaced by a two-input NAND gate 43. NAND gate 43 receives one of its two inputs from the output of inverter 22. The other input to NAND gate 43 is a programmable or otherwise logically selectable enable signal. Configured in this manner, start-up stage 39a controls activation of characterization circuit 30 in accordance with the logic level of the enable input into NAND gate 43. When the enable input is asserted and maintained at a logic high, NAND gate 43 functions with respect to the output of inverter 22 as an inverter and the logic level from the complementary RBL output is allowed to switch, thus permitting characterization circuit 30 to operate in an oscillation testing mode. Characterization circuit 30 may be disabled by setting the enable input to a logic low which results in an unchanging and therefore non-inverting output to one of the complementary RBL outputs.

Figure 4A:
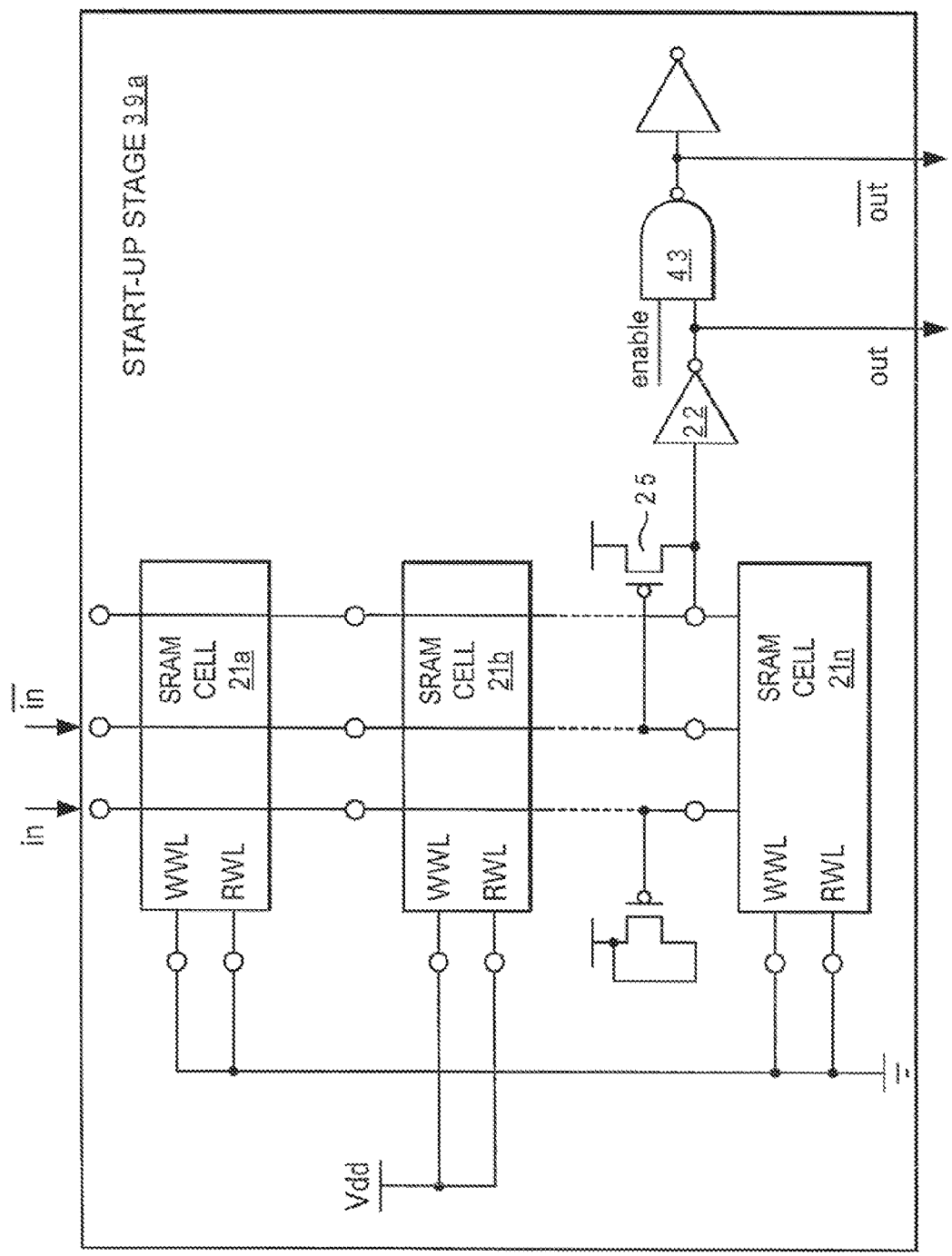
FIGS. 4a-4d are diagrams of start-up circuit stages within the ring oscillator test structure from FIG. 3, in accordance with various embodiments of the present invention.
Figure 4B:
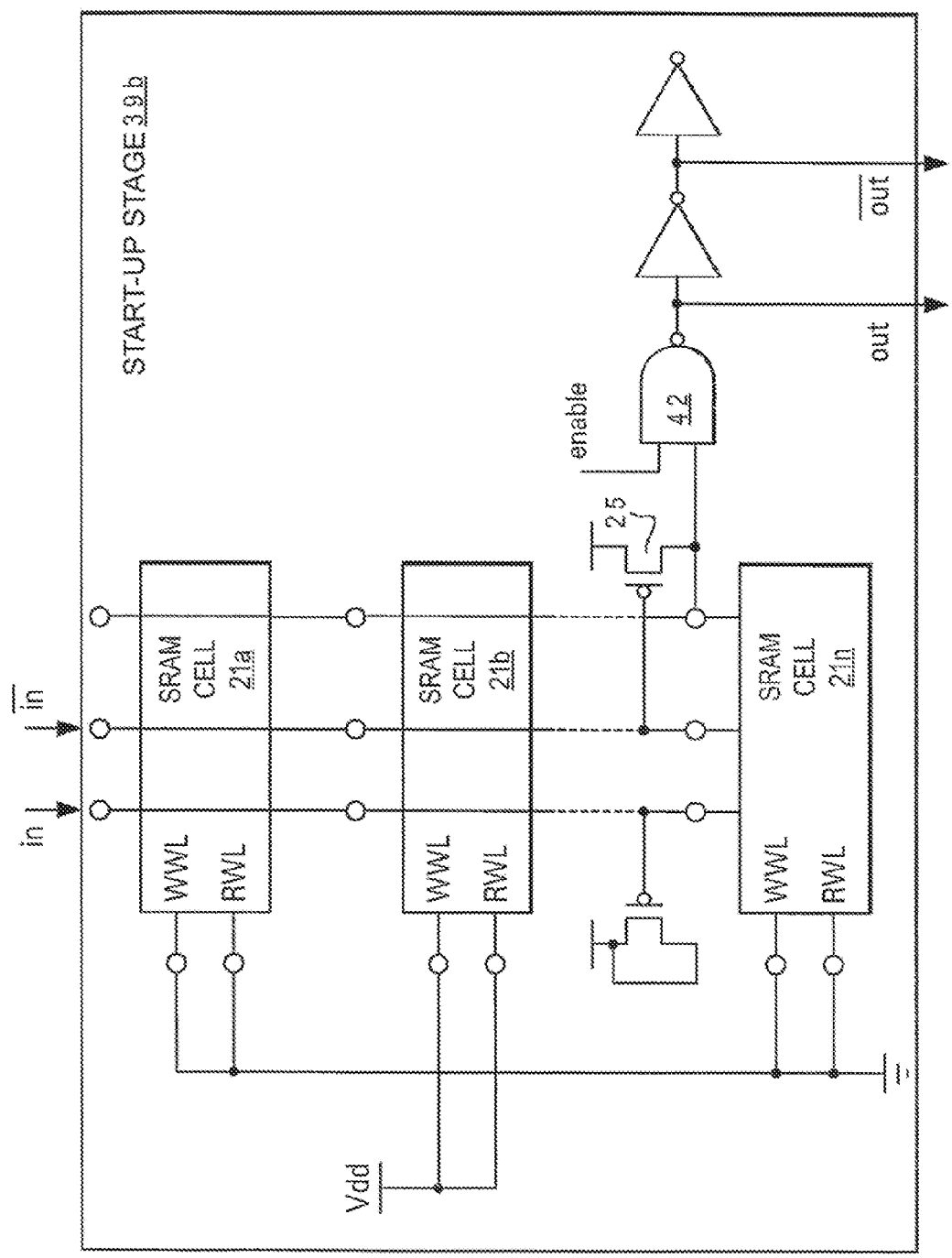

The difference between start-up stage 39b in FIG. 4b and memory cell column 20 from FIG. 2 is that inverter 22 in FIG. 2 is replaced by a two-input NAND gate 42. NAND gate 42 receives one of its two inputs from the local RBL node. The other input to NAND gate 42 is a programmable or otherwise logically selectable enable signal. Start-up stage 39b controls activation of characterization circuit 30 in accordance with the logic level of the enable input into NAND gate 42. When enable is asserted and maintained at a logic high, NAND gate 42 functions as an inverter with respect to the RBL logic level. The logic level from the complementary RBL output is allowed to switch, thus permitting characterization circuit 30 to operate in an oscillation mode. Characterization circuit 30 is disabled by setting the enable input to a logic low, resulting in an unchanging and therefore non-inverting output to both of the complementary pair of RBL outputs.

Figure 4C:
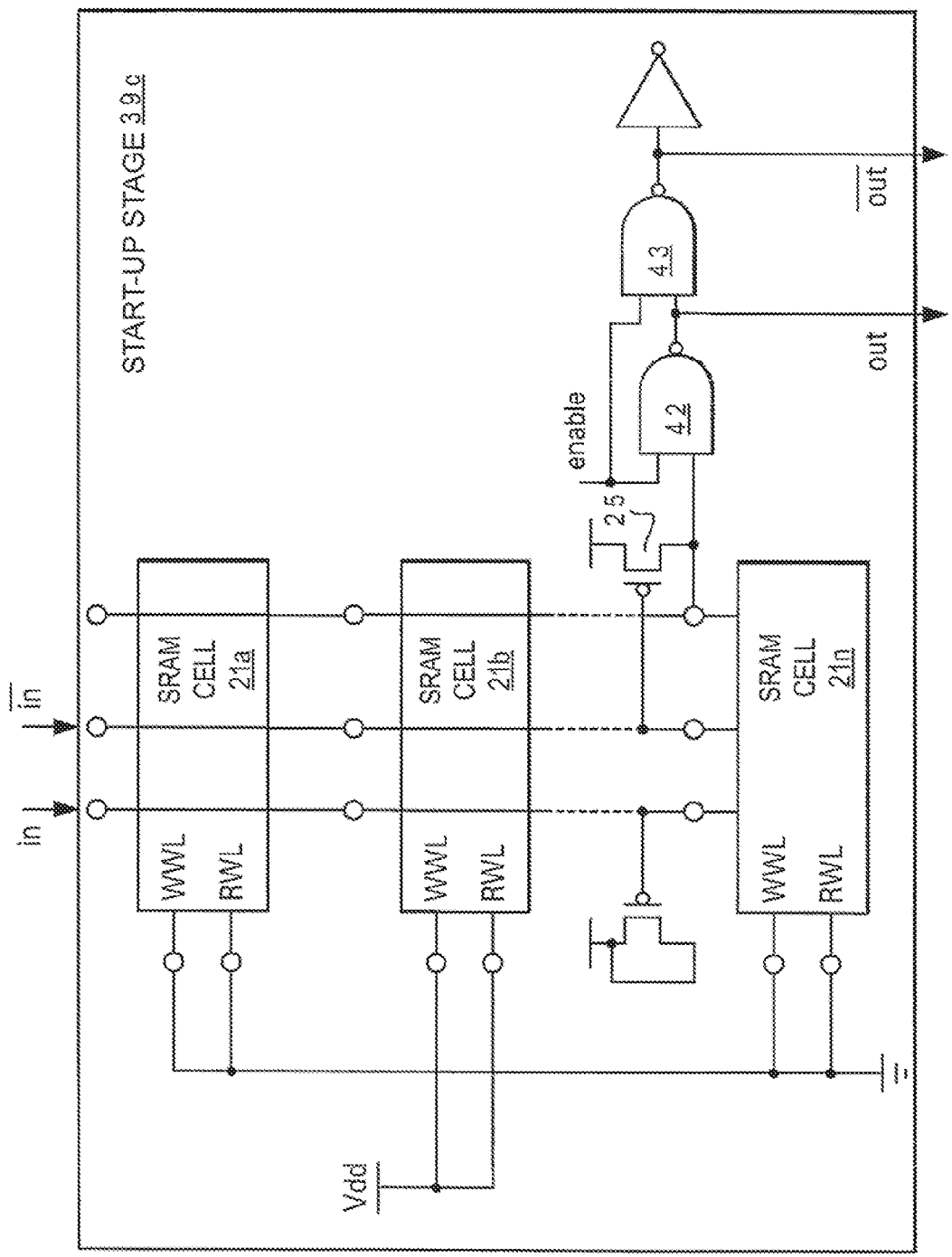

The differences between start-up stage 39c in FIG. 4c and memory cell column 20 from FIG. 2 are that inverters 22-23 in FIG. 2 are replaced by two-input NAND gates 42-43, respectively. NAND gate 42 receives one of its inputs from the local RBL node. The other input to NAND gate 42 is a programmable or otherwise logically selectable enable signal. NAND gate 43 receives one of its inputs from the output of NAND gate 42 and the other input is connected to the same enable signal. Start-up stage 39c controls activation of characterization circuit 30 in accordance with the logic level of the enable input into NAND gates 42 and 43. When enable is asserted and maintained at a logic high, NAND gate 42 functions as an inverter with respect to the RBL logic level and NAND gate 43 functions as an inverter with respect to the output of NAND gate 42. In this configuration, the logic level from the complementary RBL output is allowed to switch, thus permitting characterization circuit 30 to operate in an oscillation mode. Characterization circuit 30 is disabled by setting the enable input to a logic low, resulting in an unchanging and therefore non-inverting output to both of the complementary pair of RBL outputs.

Figure 4D:
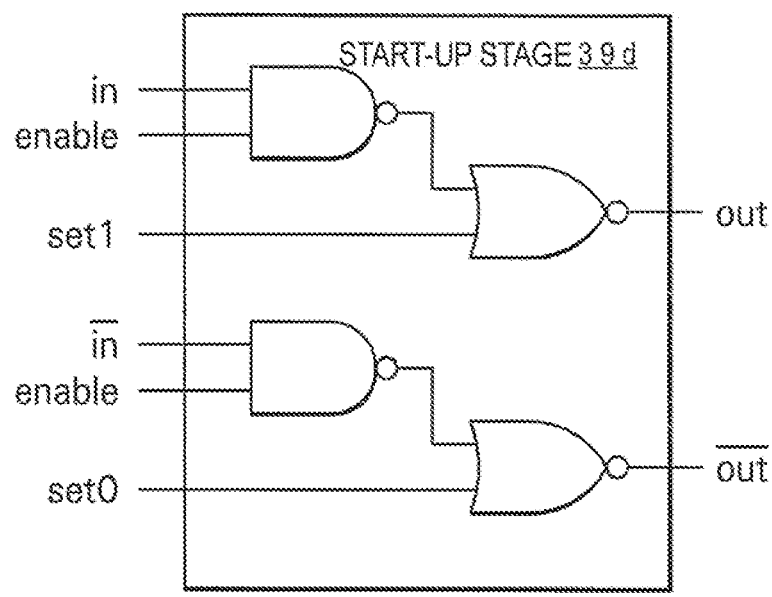

Start-up stage 39d can be implemented with AND and NOR logic gates as shown in FIG. 4d. Inputs set0 and set1 are two independent set bits that are used to program the contents of unselected bits in each of oscillator stages 31-38.

To more accurately simulate the actual loading present in a production memory array having a dynamic precharge topology, each of the transistors in the output inverters/buffers such as those within start-up stages 39a-39d depicted in FIGS. 4a-4d is preferably sized so that for a bitline logic state corresponding to a precharge state, the corresponding output transistor or transistor chain is sized to simulate exactly the precharge pull-up transistor in a production array. Similarly, the transistor chain in the output stage of drive transistors can be sized to exactly simulate the write pull-down transistors used to discharge one of the bitlines during a write operation. It should also be noted that the supply voltage of drive transistors does not have to match that of the SRAM cells, which permits the voltage of SRAM cells to be variably reduced for testing purposes.

Figure 5:
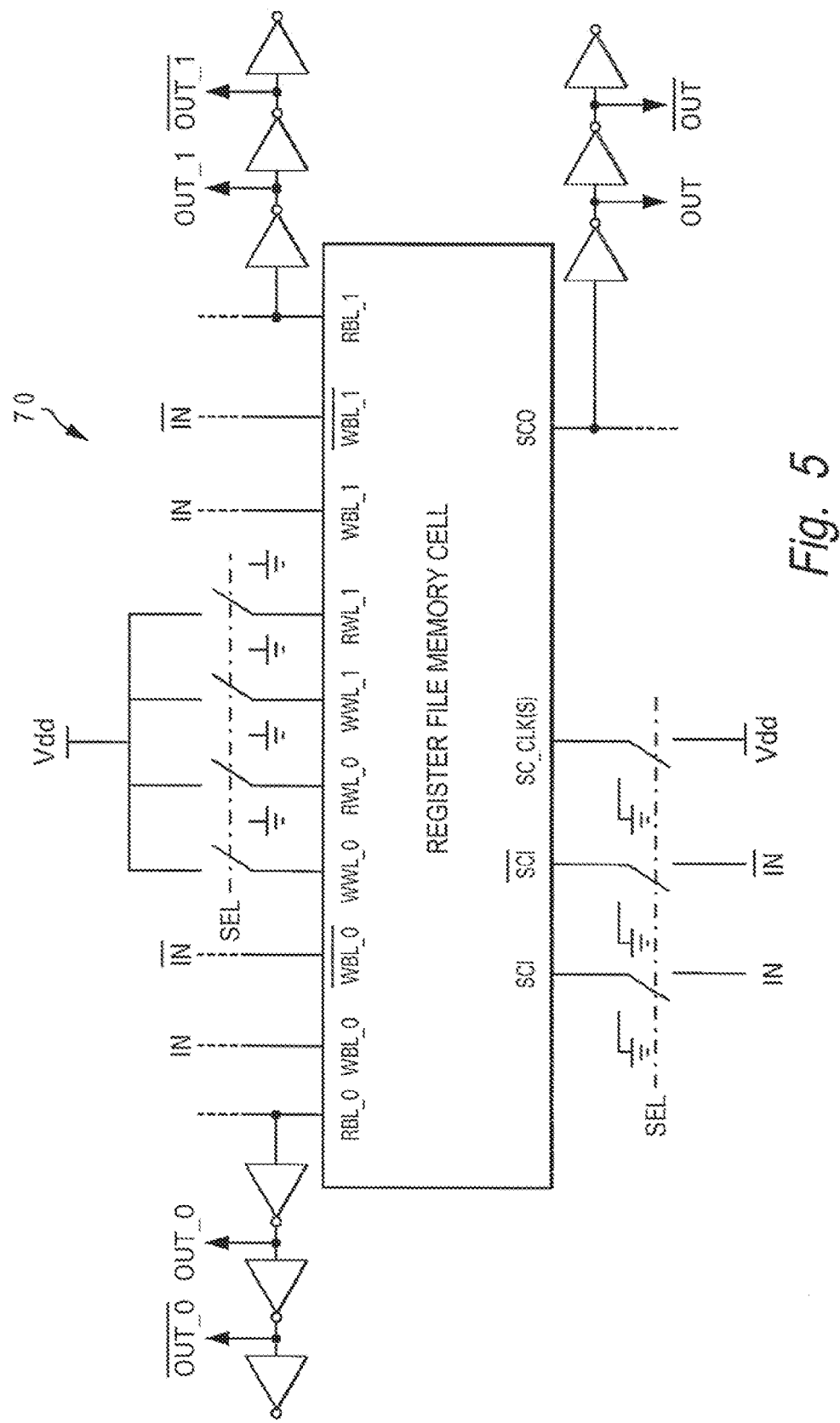
FIG. 5 is a diagram depicting a multi-port register file memory cell as implemented in the test structure in accordance with one embodiment of the present invention.

FIG. 5 depicts a multi-port register file (RF) memory cell 70 as implemented in a test structure in accordance with one embodiment of the present invention. RF memory cell 70 may assume a variety of internal circuit topologies. Depending on the topology of the production array, RF memory cell 70 may comprise an SRAM topology having a precharge read bitline topology, similar to that depicted in FIG. 2, or a non-precharge read bitline topology. As shown in FIG. 5, RF memory cell 70 includes multiple data path access nodes in the form of multiple write bitline inputs and multiple read bitline outputs. Specifically, RF memory cell 70 includes two independently selectable complementary pair write bitline inputs, WBL_0 and WBL_1 and corresponding read bitline outputs RBL_0 and RBL_1. Similar to the configuration shown in FIGS. 2 and 3, and as explained below with reference to FIG. 6, RF memory cell 70 is incorporated within a memory cell column comprising multiple other such cells interconnected such that the write and read bitlines are shared among the multiple cells.

To further achieve substantially identical circuit topology and loading as a production RF memory array, RF memory cell 70 further includes scan test circuitry. Specifically, RF memory cell 70 includes a scan test complementary pair input, SCI, for providing a complementary input to boundary scan test input circuitry contained within RF memory cell 70. A corresponding scan test output port, SCO, is logically coupled via internal scan test and datapath circuitry (not depicted) to the input scan test ports. Since, as is known in the art of scan testing in memory arrays, scan input and output circuits provide access to and from the data path of a given memory cell, the scan test inputs and outputs share may also be considered data path access nodes. Similar to the memory cell configuration illustrated in FIGS. 2 and 4a-4b, the output from the read and scan outputs OUT_0, OUT_1, and SCO from RF memory cell 70 on the shared read bitlines are serially coupled to inverting logic in the form of serially coupled inverters to provide inverted, complementary pair outputs.

Figure 6:
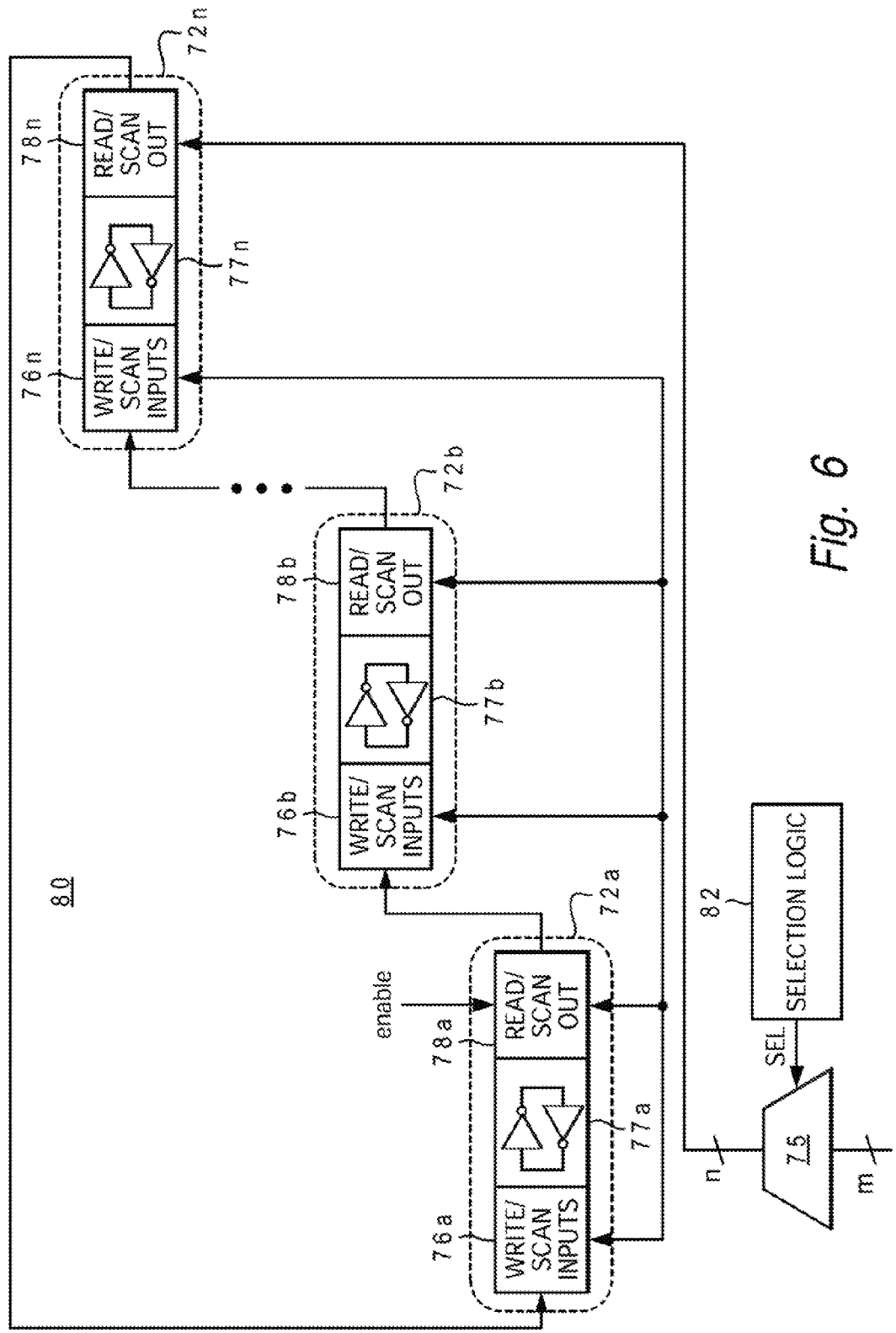
FIG. 6 is a diagram illustrating a test structure having multiple memory cell columns each comprising multiple multi-port register file memory cells in accordance with one embodiment of the present invention.

FIG. 6 illustrates a test structure 80 having multiple memory cell columns 72a-72n each comprising multiple multi-port RF memory cells such as RF memory cell 70 in accordance with one embodiment of the present invention. Test structure 80 generally comprises multiple memory cell columns 72a-72n serially interconnected in a ring oscillator configuration with memory cell column 72a having an enable input and serving as a startup cell similarly to the startup cell configurations described with reference to FIGS. 3 and 4a-4d. Similar to characterization circuit 30 shown in FIG. 3 and consistent with the RF memory cell embodiment shown in FIG. 5, each of the memory cell columns includes a pair of complementary inputs and a pair of complementary outputs. The start-up stage 72a includes a pair of complementary inputs, a pair of complementary outputs, and the enable input. The ring configuration of test structure 80 is formed by connecting the complementary outputs of one of the multi-port cell columns to the complementary inputs of a subsequent one of the multi-port cell columns. These columns are physically tiled to form an array having a substantially identical layout footprint as a production array (not depicted).

As further depicted in FIG. 6, each of memory cell columns 72a-72n includes write/scan inputs 76a-76n, respectively. Referring to FIG. 5 in conjunction with FIG. 6, each of the blocks representing write/scan inputs 76a-76n collectively represents the write and scan input circuits for the constituent multi-port RF memory cells of each memory cell column. Using RF memory cell 70 as an example, the corresponding one of write/scan inputs 76a-76n would include input write bitline ports WBL_0 and WBL_1 (and the depicted complements) as well as the corresponding enablement wordline ports WWL_0 and WWL_1. Write/scan inputs 76a-76n further include scan test complementary pair input SCI and scan clock input SC_CLK.

Memory cell columns 72a-72n further include latching nodes 77a-77n, respectively, in which for the designated driver memory cell within each memory cell column, data is written to and read from. Memory cell columns 72a-72n also include read/scan outputs 78a-78n, respectively. Referring to FIG. 5 in conjunction with FIG. 6, each of the blocks representing read/scan outputs 78a-78n collectively represents the read ports and scan output ports for the constituent RF memory cells of each respective memory cell column. Again using RF memory cell 70 as an example, the corresponding one of read/scan outputs 78a-78n would include read bitline ports RBL_0 and RBL_1 as well as the corresponding read wordline ports RWL_0 and RWL_1. Read/scan outputs 78a-78n further include scan test output SCO and scan clock SC_CLK.

Multiple memory cell columns 72n-72n are connected in series in a ring oscillator configuration in which the read/scan outputs 78a-78n of each column, depicted in FIG. 6 as OUT_0, OUT_1, and scan out SCO signals, are coupled to the corresponding write/scan inputs 76a-76n of the subsequent memory cell column in a similar fashion to that described with reference to FIG. 3. The ring oscillator formed by memory cell columns 72a-72n is preferably fabricated on a wafer substrate in common with and proximate to a production SRAM array (not depicted) having a specified circuit topology and fabrication layout geometry. The memory cell columns 72a-72n and constituent multi-port RF memory cells have a circuit topology substantially identical to the circuit topology of memory cells within the production SRAM array. In this manner the timing behavior of the production array can be accurately assessed including accounting for local bitline loading effects without altering the physical and logical structure or the behavior of the production array. A test chip (depicted in FIG. 7) containing test structure 80 may be implemented in a test circuit permanently wired-in-place or in a sacrificial metal for a circuit on a production wafer, which can then be modified into an operational memory circuit via a permanent metal layer that replaces the sacrificial layer. Part or all of test structure 80 may also be implemented on a wafer kerf immediately adjacent to the production array and be discarded after testing.

In accordance with the depicted embodiment, test structure 80 further includes selection control circuitry and logic that selectively enables and disables the multiple data path access nodes for the RF memory cells within memory cell columns 72a-72n. The selection control circuitry is generally represented in FIG. 6 as a MUX 75 and selection control logic block 82. MUX 75 is a simplified representation of the switches depicted in FIG. 5 for the write and read wordlines, scan inputs, and scan clock for RF memory cell 70. MUX 75 may be implemented and distributed within test structure 80 using any passgate, transmission gate, NAND/NOR, AND-OR-INVERT (AOI)/OR-AND-INVERT (OAI) multiplexing structures.

Referring to FIG. 5 in conjunction with FIG. 6, the switches for the write and read wordline inputs and the scan clock input are selectively switchable between power supply (Vdd) and ground in accordance with one or more selection signals from selection control logic 82. Likewise, the switches for the complementary scan input ports SCI switch between the scan data input ports and ground in accordance with the selection signal(s) from selection control logic 82. In accordance with one aspect of the present invention, selection control logic block 82 includes logic for selectively setting the switches and consequently enabling or disabling the various data path access nodes including all nodes depicted in FIG. 5 as coupled to selectively enabled/disabled inputs.

The selection control signals generated from selection control logic 82 are applied via MUX 75 as enablement/disablement signals to the write/scan inputs 76a-76n and read/scan outputs 78a-78n of memory cell columns 72a-72n. The selection control signals from MUX 75 are applied to the write wordline enablement inputs, such as the WWL_0 and WWL_1 inputs for selectively enabling or disabling the corresponding write bitline inputs within memory cell columns 72a-72n. Selection control signals are also selectively applied from MUX 75 to the read wordline enablement inputs, such as the RWL_0 and RWL_1 inputs for selectively enabling or disabling the corresponding read bitline outputs.

The multi-port selectability provided by test structure 80 substantially enhances ring oscillator characterization circuit functionality by allowing comprehensive and flexible testing of various data path and scan test circuit features. For the depicted two-read and two-write port memory cell configuration depicted in FIGS. 5 and 6, selection control logic 82 may be programmed or otherwise logically configured to selectively enable/disable the multiple data path access nodes for the constituent RF memory cells within the memory cell columns 72a-72n. For example, the write-to-read data path of a production memory array can be flexibly tested by selectively enabling one of the write bitline complementary pair inputs such as WBL_0 and its corresponding read bitline output RBL_0 while disabling WBL_1 and RBL_1. In another embodiment, multiple, simultaneous read operations can be monitored by enabling both read bitline ports RBL_0 and RBL_1 simultaneous.

In still another test configuration, selection control logic 82 may implement a scan testing configuration. Such scan path testing may be implemented by disabling either the write bitline input ports WBL_0 and WBL_1 and/or the read bitline input ports RBL_0 and RBL_1 and simultaneously enabling either or both of scan input and output circuitry contained within write/scan input blocks 76a-76n and read/scan output blocks 78a-78n, respectively. To test the front end scan port, selection control logic 82 enables the scan input logic contained in write/scan input blocks 76a-76n and one of the read bitlines such as RBL_0 while disabling both write bitline inputs WBL_0 and WBL_1 and the unselected RBL_1. To test the back end scan output circuitry, selection control logic 82 enables one of the write bitlines such as WBL_0 and the scan output logic contained in read/scan output blocks 78a-78n while disabling both read bitlines RBL_0 and RBL_1 and the unselected WBL_1.

Figure 7:
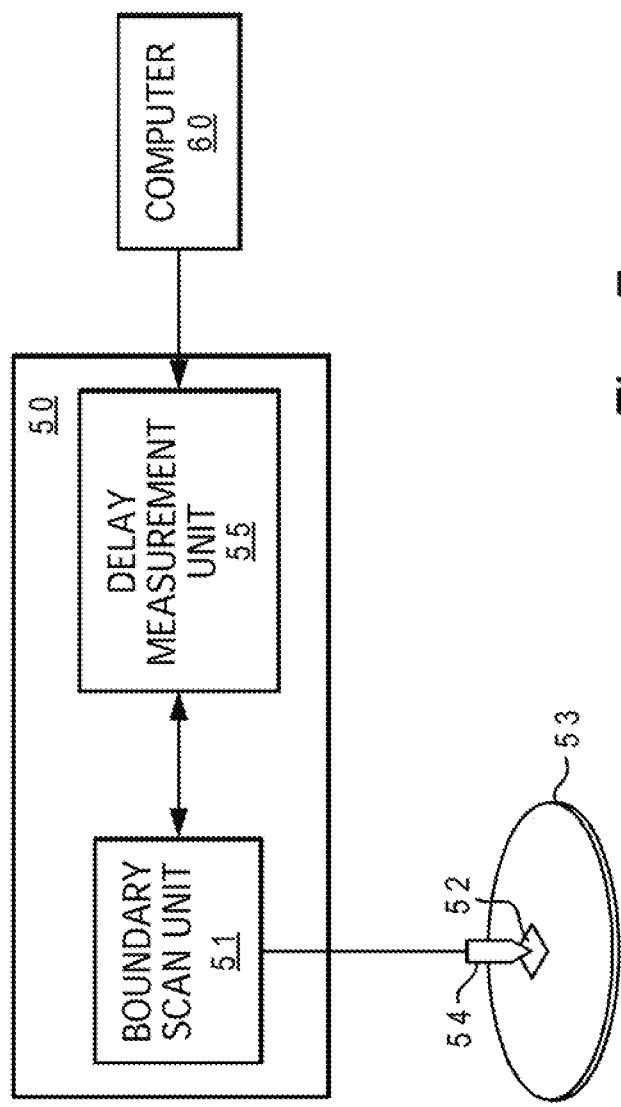
FIG. 7 is a block diagram of a wafer testing system, in accordance with a preferred embodiment of the present invention.

Referring now to FIG. 7, there is depicted a block diagram of a wafer test system, in accordance with a preferred embodiment of the present invention. As shown, a wafer tester 50 includes a boundary scan unit 51 for providing stimulus to and retrieving data from a chip 52 on a wafer under test 53 via a probe head 54 having electrical test connections to chip 52. Wafer tester 50 also includes a delay measurement unit 55 that evaluates a frequency of the above-mentioned ring oscillator characterization circuit implemented by multiple columns of memory cells each having memory cell drive devices. Wafer tester 50 also includes a programmable power supply (not shown) for supplying memory cell power supply rail voltage so that the memory cell supply voltage can be varied during testing.

A computer 60 is coupled to wafer tester 50 for executing program instructions to receive data produced by circuits within chip 52. The data are collected from multiple ring oscillator characterization circuits within or proximate to (such as within an adjacent kerf region) chip 52 as power supply voltages are varied by the programmable power supply, and loading/leakage characteristics are changed by using boundary scan unit 51 to read/write test memory cell values and/or connect and disconnect other memory cells in the other rows to true or complement bitlines to isolate the read versus write delay characteristics of memory cells.

The results of all of the measurements can then be evaluated for changing the design of the memory array or memory cells, for determining whether fabrication process has deviated exceedingly from tolerable norms or for determining operational ranges such as power supply voltage tolerances and access times. Data from ring oscillator test structures/delay line tests are transferred to computer 60 via wafer tester 50.

As has been described, the present invention provides a ring oscillator test structure for characterizing memory arrays. The loading experienced by the memory cells in the ring oscillator test structure is identical to that of a set of ordinary memory cells. As such, an accurate measure of the delays within the memory cells in an actual memory array implementation can be obtained.

While the invention has been particularly shown and described with reference to a preferred embodiment, it will be understood by those skilled in the art that various changes in form and detail may be made therein without departing from the spirit and scope of the invention.

What is claimed is:

1. A test structure for characterizing a production static random access memory (SRAM) array, said test structure comprising
a plurality of memory cell columns connected in series to form a ring configuration and fabricated on a wafer substrate in common with and proximate to a production SRAM array having a specified circuit topology and fabrication layout geometry, wherein said plurality of memory cell columns include SRAM cells having a circuit topology corresponding to the circuit topology of memory cells within the production SRAM array.

2. The test structure of claim 1, wherein said plurality of memory cell columns have a fabrication layout geometry corresponding to the fabrication layout geometry of said production SRAM array.

3. The test structure of claim 1, wherein said plurality of memory cell columns comprise:
an even number of memory cell columns connected in series, wherein each of said memory cell columns includes a pair of complementary write bitline inputs and a pair of corresponding complementary outputs formed by a read bitline connected in series with a plurality of inverters; and
a start-up memory cell column connected to said even number of memory cell columns and including a pair of complementary inputs, a pair of complementary outputs, and an enable input.

4. The test structure of claim 3, wherein said pair of complementary outputs from said start-up memory cell column is formed by a read bitline connected in series with a plurality of inverters and an NAND gate, wherein said enable input is applied as an input to said NAND gate.

5. The test structure of claim 3, wherein said pair of complementary outputs from said start-up memory cell is formed by a read bitline connected in series with an inverter and a plurality of NAND gates, wherein said enable input is applied in parallel as an input to said plurality of NAND gates.

6. A test structure for characterizing a static random access memory (SRAM) array, said test structure comprising:
an even number of SRAM cell columns connected in series, wherein each of said SRAM cell columns includes a pair of complementary inputs and a pair of complementary outputs; and
a start-up SRAM cell column connected to said even number of SRAM cell columns to form a ring configuration, wherein said start-up SRAM cell column includes a pair of complementary inputs, a pair of complementary outputs, and an enable input.

7. The test structure of claim 6, wherein said pair of complementary inputs is formed by a pair of complementary write bitlines.

8. The test structure of claim 6, wherein said pair of complementary outputs is formed by a read bitline connected in series with a plurality of inverters.

9. The test structure of claim 6, wherein each of said SRAM cell columns includes a read wordline and a write wordline, and wherein a read wordline and a write wordline of one SRAM cell within one of said SRAM cell columns are connected to a power supply while read wordlines and write wordlines of remaining SRAM cells within said SRAM cell column are connected to ground.

* * * * *